United States Patent [19]

Hirata et al.

[11] Patent Number: 4,890,152

[45] Date of Patent: Dec. 26, 1989

[54] PLASTIC MOLDED CHIP CARRIER PACKAGE AND METHOD OF FABRICATING THE SAME

[75] Inventors: Atsuomi Hirata, Nara; Hirokuni Mamiya, Yokkaichi, both of Japan

[73] Assignee: Matsushita Electric Works, Ltd., Kadoma, Japan

[21] Appl. No.: 8,222

[22] Filed: Jan. 29, 1987

[30] Foreign Application Priority Data

Feb. 14, 1986 [JP] Japan .................................. 61-31355
Apr. 30, 1986 [JP] Japan ................................. 61-100019
Apr. 30, 1986 [JP] Japan ................................. 61-100020

[51] Int. Cl.$^4$ ........................................ H01L 23/28
[52] U.S. Cl. .................................... 357/72; 357/74; 174/52.5
[58] Field of Search ................... 357/70, 72, 81, 74; 174/52 FP, 16 HS, 52.5

[56] References Cited

U.S. PATENT DOCUMENTS

| | | | |
|---|---|---|---|
| 3,495,023 | 2/1970 | Hessinger et al. | 174/52 FP |
| 3,585,272 | 6/1971 | Shatz | 357/72 |
| 3,684,817 | 8/1972 | Card, Jr. et al. | 357/74 |
| 4,082,394 | 4/1978 | Gedney et al. | 357/74 |
| 4,107,727 | 8/1978 | Ikezawa et al. | 357/72 |
| 4,126,882 | 11/1978 | Carson et al. | 357/74 |
| 4,322,778 | 3/1982 | Barbour et al. | 357/74 |
| 4,326,214 | 4/1982 | Trueblood . | |
| 4,338,612 | 7/1982 | Braun . | |
| 4,513,355 | 4/1985 | Schroeder et al. | 357/74 |
| 4,530,002 | 7/1985 | Kanai | 357/70 |
| 4,618,739 | 10/1986 | Theobald | 174/52 FP |
| 4,700,473 | 10/1987 | Freyman et al. . | |
| 4,723,156 | 2/1988 | Okuaki . | |

FOREIGN PATENT DOCUMENTS

| | | |
|---|---|---|
| 0155044 | 9/1985 | European Pat. Off. . |
| 0218796 | 4/1987 | European Pat. Off. . |
| 0223234 | 5/1987 | European Pat. Off. . |
| 0268181 | 5/1988 | European Pat. Off. . |
| 52-13772 | 2/1977 | Japan .......... 357/70 |
| 52-58370 | 5/1977 | Japan .......... 357/81 A |
| 57-96562 | 6/1982 | Japan .......... 357/70 |
| 57-145335 | 9/1982 | Japan .......... 357/70 |
| 59-58851 | 4/1984 | Japan .......... 357/70 |
| 59-207645 | 11/1984 | Japan .......... 357/70 |
| 61-174752 | 8/1986 | Japan . |
| 62-40754 | 1/1987 | Japan . |
| 62-40749 | 2/1987 | Japan . |
| 62-145753 | 6/1987 | Japan . |

OTHER PUBLICATIONS

Dion et al; Module Package; IBM Technical Disclosure Bulletin; vol. 7, No. 7, Dec. 1964, p. 556.

(List continued on next page.)

Primary Examiner—Rolf Hille
Assistant Examiner—Steven Ho Yin Loke
Attorney, Agent, or Firm—Armstrong, Nikaido, Marmelstein et al.

[57] ABSTRACT

A novel plastic molded chip carrier package for an integrated circuit chip has a carrier member molded of a plastic material to which are integrally embedded a plurality of I/O pins and a conductor member for interconnection between the terminals of the chip and the corresponding I/O pins to provide a unitary construction obtained at a single molding process. This plastic molded chip carrier package is preferred to have integral positioning studs which project in the same direction of the I/O pins for abutment against a printed circuit board for mounting the package in a spaced relation thereto with the I/O pins plugged into metallized through holes provided in the board. A method of fabricating the plastic chip carrier package is also disclosed to comprise the steps of placing a plurality of I/O pins into corresponding vertical slots formed in a molding die with the top portion of the I/O pins projecting above the molding die surface; supporting a conductor member on the I/O pins with the distal top ends of the I/O pins extending into correspondingly through holes formed in the conductor member, the conductor member including a plurality of conductor lines for electrical interconnection between the individual I/O pins and the terminals of the chip; and filling a molten plastic material at least between the conductor member and the molding die surface and solidifying the same so as to form thereat a plastic carrier member to which the conductor member is integrally embedded together with the top portions of the I/O pins.

24 Claims, 6 Drawing Sheets

OTHER PUBLICATIONS

Funari et al; Flanged Pin MC Substrate Design; IBM Technical Disclosure Bulletin; vol. 21, No. 1, Jun. 1978, p. 94.
IBM Technical Disclosure Bulletin, vol. 27, No. 3, Aug. 1984, p. 1682, New York, U.S.; M. P. Bourgeois et al.: "Plastic Pin Array Package."
IBM Technical Disclosure Bulletin, vol. 15, No. 3, "Connector Interposer for Module-to-Board Electrical Interconnection"; R. L. Agard, et al.
IBM Technical Disclosure Bulletin, vol. 21, No. 1, Jun. 1978, "Flanged Pin Mc Substrate Design", J. Funari et al.
IBM Technical Disclosure Bulletin, vol. 15, No. 1, Jun. 1972, "Eighty-Pin Package for Field-Effect Transistor Chips"; Hohn.

PLASTIC MOLDED CHIP CARRIER PACKAGE AND METHOD OF FABRICATING THE SAME

BACKGROUND OF THE INVENTION

1. Field of the Invention

The present invention is directed to a plastic molded chip carrier package and a method of fabricating the same, and more particularly to a plasic package having a plurality of I/O pins and an integrally embedded conductor member for electrical interconnection of the chip to the individual I/O pins, and to a method of fabricating such a package.

2. Description of the Prior Art

Plastic chip carrier packages have been widely accepted in the art to replace ceramic packages for their feasibility of incorporating a plurality of I/O pins at the time of molding the package and for thermal compatibility with conventionally printed-circuit boards on which the packages are frequently required to be directly mounted. Such plastic packages have been proposed, for example, in U.S. Pat. No. 4,618,739 in which a chip carrier is molded from a suitable plastic material to integrally include a plurality of I/O pins. This package requires a separately formed metallized layer which should be bonded onto the molded chip carrier for interconnection of the I/O pins and a chip to be disposed centrally of the carrier, adding the bonding process to the fabrication of the package with accompanied difficulty for secure registration of conductor lines on the metallized layer with the corresponding I/O pins. The employment of the separately formed metallized layer inherently poses a problem that the conductor lines may fail to be securely connected to the respective I/O pins due to possible poor bonding between the metallized layer and the molded chip carrier. In this respect, the prior plastic packages suffer from rather complicated fabrication process as well as reduced reliability in the connection beween the conductor lines of the metallized layer and the respective I/O pins.

SUMMARY OF THE INVENTION

The present invention eliminates the above problem and provides an advantageous plastic molded chip carrier package and a method of fabricating the same. The chip carrier package in accordance with the present invention comprises a carrier member made of a plastic material for mounting an integrated circuit chip and a plurality of I/O pins, each protruding from the carrier member with its tip portion being integrally embedded therein. Also integrally embedded to the carrier member is a conductor member which has a plurality of conductor lines for interconnection between terminal pads of the chip and the corresponding I/O pins. Accordingly, the chip carrier member can be integrally formed with the conductor member having the plural conductor lines together with the I/O pins so that the package is made into a unitary construction in which the conductor member is securely attached to the carrier member for reliable electrical connection between the chip and the I/O pins. This unitary construction of the package, including the conductor member, enables the fabrication thereof to be made readily only through a single molding process with enhanced productivity.

It is therefore a primary object of the present invention to provide a plastic molded chip carrier package in which the conductor member is securely incorporated in the chip carrier member without requiring another bonding process.

In the meanwhile, there is a growing demand for the chip carrier package to be directly mounted on a conventionally printed circuit board with the I/O pins plugged into metallized through holes formed therein. For this application, it is required to provide on the side of the package positioning projections which abut against the board for supporting the package in a spaced relation thereto. To this end, the chip carrier member of the present invention includes at least one pair of positioning studs which are integrally molded therewith to project in the same direction of the I/O pins. By the nature of the integral molding of the plastic chip carrier member, the positioning studs can be readily added to the carrier member or package without requiring any other separate parts. In addition to that it is kept intact with any electric circuit on the board and never damages the same.

It is therefore another object of the present invention to provide a plastic molded chip carrier package in which positioning studs can be easily formed thereon for permitting direct mounting of the package on a conventional printed circuit board, yet preventing the positioning stud from damaging the electric circuit formed on the board.

In preferred embodiments, there is incorporated in the chip carrier member, a heat sink member having greater thermal conductivity than the carrier member. The heat sink member is also integrally embedded in the carrier member at the time of molding the latter with its heat radiation surface exposed and with the opposite surface defining a chip mounting surface.

It is therefore a further object of the present invention to provide a plastic molded chip carrier package in which a heat sink member is integrally embedded in the chip carrier member for enhancing heat radiation capacity.

Preferably, the heat sink member is of a flat shape with its side wall being inclined inwardly from the chip mounting surface adjacent the conductor member to the opposed heat radiation surface. Also formed with the heat sink member is an external flange which extends sidewardly from the periphery of the heat radiation surface. With this provision of the inclined sidewall plus the external flange, the heat sink member is firmly embeded within the chip carrier member to increase the bonding strength therebetween, which is a further object of the present invention.

In preferred embodiments, each of the conductor lines has a through hole into which the corresponding I/O pin extends with its distal top end projecting above the conductor line. The conductor lines are embedded within the chip carrier member which is molded to have in the top surface thereof a plurality of soldering pits at registering locations with the individual through holes for exposing therein the distal top ends of the I/O pins and the adjacent conductor line portions. The soldering pits thus formed are respectively filled with a soldering material for providing permanent and reliable electrical connection between the conductor lines and the corresponding I/O pins.

It is therefore a further object of the present invention to provide a plastic molded chip carrier package in which the conductor lines and the corresponding I/O pins can be permanently and reliably joined after the molding the chip carrier member.

The conductor member integrally embedded to the molded plastic carrier member is preferably in the form of a metallized layer having the plural conductor lines formed on a substrate and having a center opening of a size smaller than a center recess formed in the carrier member. The center recess has is bottom defined by the top surface of the heat sink member also integrally embedded in the carrier member. The metallized layer is incorporated in the carrier member in such a manner as to extend into the center recess the inner peripheral edge portion including the inner lead ends of the conductor lines arranged on that edge portion. Thus, the inner lead ends of the metallized layer is exposed in the center recess for connection with the chip to be mounted on the top surface of the heat sink member or on the bottom of the center recess. The inner peripheral edge portion of the metallized layer including the inner lead ends of the conductor lines and extending into the center recess is backed up by the peripheral portion of the heat sink member so as to be kept aligned on the plane of the heat sink member for easy and reliable connection to the terminal pads of the chip such as by a known wire bonding.

It is therefore a further object of the present invention to provide a plastic molded chip carrier package in which the inner lead ends of the conductor lines are kept in aligned positions with the terminal pads of the chip by better utilization of the heat sink member integrally embedded in the package.

There is disclosed in the present invention another preferred embodiment in which a plurality of metallized layers are integrally embedded within the carrier member in a stacking relation for providing a higher circuit density. Provided in the metallized layers, each composed of a plurality of conductor lines formed on a substrate, are respective center openings having a common center and being of sizes smaller than the center recess of the carrier member. The metallized layers are stacked to have the center opening of the larger size in the upper metallized layer than in the lower metallized layer such that the inner lead ends of the conductor lines on the metallized layers are all exposed in staggered relation with each other for assuring electrical connection of the individual metallized layers with the chip.

It is therefore a further object of the present invention to provide a plastic molded chip carrier package in which the metallized layers are embedded in a multilayer construction enabling the package to be adapted for higher package density applications.

Further, the chip itself may be integrally molded or encapsulated within the carrier member together with the metallized layer and the I/O pins so as to entirely seal off the electrical parts and their connections for protection thereof from the atmospheric environment, which is a still further object of the present invention.

Also disclosed in the present invention is an advantageous method of fabricating the molded plastic chip carrier package for an integrated circuit chip having terminal pads on its active surface. According to the method, a plurality of I/O pins are placed in position with the lower ends thereof being inserted in corresponding vertical slots in a molding die so as to project the top portions thereof above the molding die surface. Then, a conductor member including a plurality of conductor lines for interconnection between the individual I/O pins and the terminal pads of chip is supported on the I/O pins with the distal top ends of the I/O pins extending into corresponding through holes respectively formed in the conductor lines. Subsequently, a molten plastic material is fed at least between the molding die surface and the conductor member held in a spaced relation thereto so as to form thereat a plastic molded chip carrier member to which the top portions of the I/O pins and the conductor member are integrally embedded. Accordingly, the plastic molded chip carrier package can be fabricated by a single molding operation and without requiring any further complicated package forming process.

It is therefore an object of the present invention to provide a simple and convenient method of fabricating the plastic molded chip carrier package with superior characteristics.

With this method, the positioning studs can be easily formed at the time of molding to integrally project from the resulting molded plastic chip carrier member by employing a molding die with a corresponding number of stud-forming to-open holes. Thus, the positioning studs can be readily obtained without requiring any other separate parts, which is therefore another object of the present invention.

In a preferred embodiment of the present invention, the chip carrier package is fabricated to integrally include therein a heat sink member and a metallized layer between a pair of separable upper and lower molding dice. The metallized layer employed has a plurality of conductor lines formed on a substrate for electrical interconnection between the terminal pads of the chip and the corresponding I/O pins. A center opening is preformed in the metallized layer around the periphery of which are arranged the inner leads ends of the conductor lines for connection to the chip to be located within that opening. The metallized layer is supported on the I/O pins, which are placed in position with its lower portions inserted in the vertical slots in the lower molding die and with its top portions projecting above the molding surface, in such a manner that the distal top ends of the I/O pins extend into corresponding through holes formed in the metallized layer. At this condition, the heat sink member placed on the lower molding die is cooperative with a core projecting on the surface of the upper molding die to hold therebetween the inner peripheral edge portion of the metallized layer on which the inner lead ends of the conductor lines are arranged, while the core has its end face closely fitted within the center opening of the metallized layer for abutment on its entire end face with the heat sink member. Subsequently, a molten plastic material is fed to the space between the upper and lower molding dice to form thereat a plastic molded carrier member in which the metallized layer and the heat sink member are integrally embedded together with the I/O pins and in which is formed a center recess after the removal of the core on the upper molding die. The resulting center recess has its bottom defined by the top surface of the heat sink member which serves as a mounting surface for the chip, while the inner lead ends of the conductor lines of the metallized layer extend into the center recess of thus molded chip carrier member for connection with the chip to be mounted in the center recess. With this method, the inner peripheral edge portion of the metallized layer including the inner lead ends can be firmly held between the heat sink member and the core of the upper molding dice as well as protected from exposed to the mold flow so that the inner peripheral edge portion is kept free from warping and further protected from entry of plastic material which would otherwise be the cause of unacceptable burr.

It is therefore a further object of the present invention to provide a method of fabricating a plastic molded chip carrier package which is capable of readily incorporate the metallized layer and the heat sink member, yet assuring a smooth and satisfactory finish to the inner lead ends of the conductor lines while preventing the formation of any burr thereon.

In a preferred embodiment, the upper molding die is formed at the individual through hole locations with pit-forming posts which extend to the distal top ends of the I/O pins to cover the same together with the adjacent conductor line portions at the time of molding the carrier member so as to form thereat soldering pits after the removal of the posts in which pits are exposed the distal top ends of the I/O pins and the adjacent conductor line portions. Thus formed pits are utilized to be filled with a soldering material for permanent electrical interconnection between the I/O pins and the corresponding conductor lines.

It is therefore a further object of the present invention to provide a method of fabricating a plastic molded chip carrier package by which the soldering pits are readily formed in the resulting chip carrier package for permanent connection between the I/O pins and the internal conductor lines with the use of a soldering material.

The heat sink member is preferably disposed on the lower molding die with its bottom end seated in a concavity formed in that die in order to prevent the mold flow from wrapping around the bottom of the heat sink member, eliminating the formation of undesirable burr thereat, which is a further object of the present invention.

The present invention disclosed the other advantageous method of fabricating a plastic molded chip carrier package in which the chip is encapsulated together with the associated metallized layer and the I/O pins within the plastic package at the time of molding thereof, eliminating no further packaging process.

These and still other objects and advantageous features of the present invention will be more apparent from the following description of the preferred embodiments when taken in conjunction with the accompanying drawings.

DESCRIPTION OF THE PREFERRED EMBODIMENTS

Figure 1:
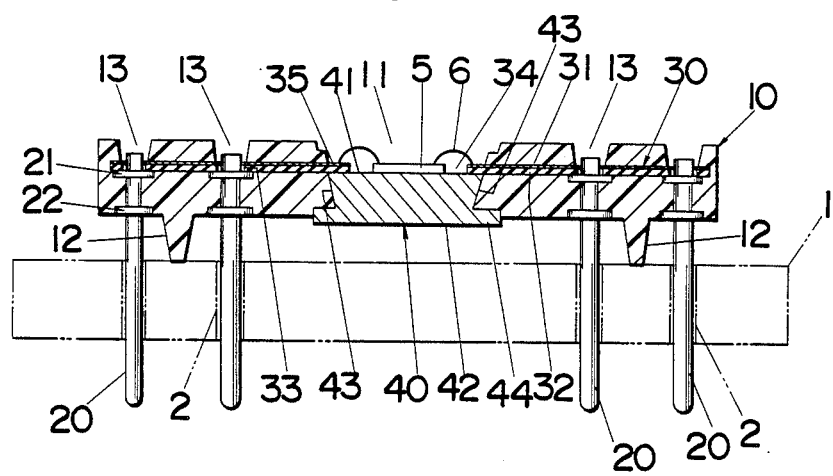
FIG. 1 is a cross sectional view of a plastic molded chip carrier package, in its mounted condition on a conventional circuit board, in accordance with a first preferred embodiment of the present invention.
Figure 2:
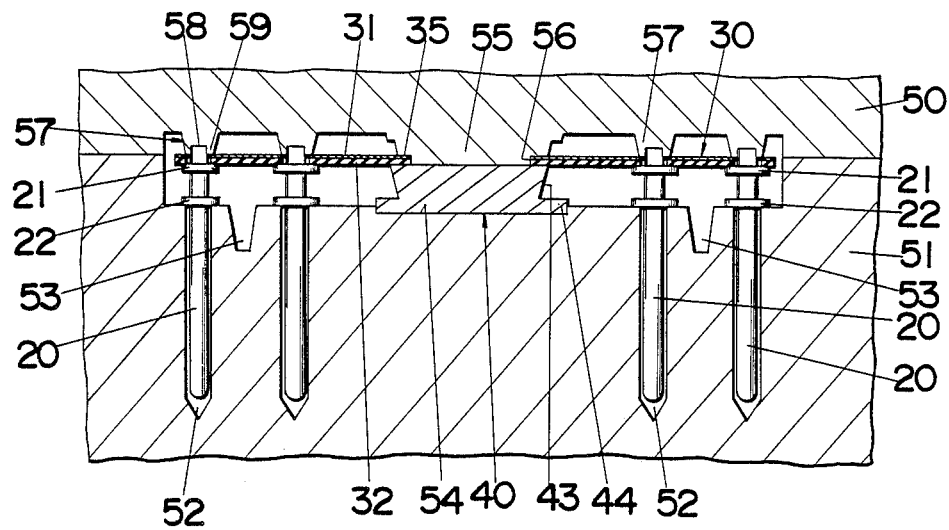
FIG. 2 is a cross sectional view illustrating a set of upper and lower molding dice utilized for molding the above package and illustrating parts placed beween the dice prior to the molding of the above package.
Figure 3:
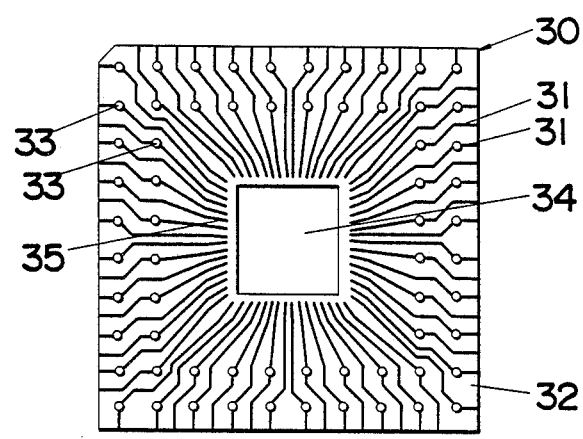
FIG. 3 is a plan view of a metallized layer embedded in the above chip carrier package.

First embodiment [FIGS. 1 to 3]

Referring now to FIG. 1, there is shown a plastic molded plastic chip carrier package in accordance with a first embodiment of the present invention. The package shown is designed to be directly mounted on a conventional circuit board 1 provided with metallized or plated through holes 2 therein, although not limited thereto. The package comprises a flat shaped carrier member 10 having a center recess 11 for mounting therein an integrated circuit chip 5, a plurality of I/O pins 20 arranged on a pin-grid to extrude from the bottom surface of the carrier member 10, and a metallized layer 30 integrally embedded in the carrier member 10. The carrier member 10 is molded from a suitable heat resistive thermoplastic or thermosetting plastic material into a flat rectangular configuration by a conventional injection or transfer molding technique. Suitable heat-resistive thermoplastic material includes polyphenylene sulphide, polysulphone, polyethersulphone, and polyarylsulphone. Suitable thermosetting plastic material includes phenol, polyimide, and epoxy resins.

Each of the I/O pins 20 has a pair of spaced shoulders 21 and 22 on its top portion both of which are anchored in the molded carrier member 10 for enhanced mechanical bonding strength with the upper shoulder 21 being in supporting contact with the metallized layer 30 and with the lower shoulder 22 being flush with the bottom surface of the carrier member 10. The metallized layer 30 is of a rectangular configuration having therein a centrally disposed rectangular opening 34 of a size smaller than the center recess 11 of the carrier member 10. The metallized layer 30 is composed of a plurality of conductor lines 31 formed on a suitable substrate 32 in a pattern of fanning in from the outer peripheral edges to the inner peripheral edges, as shown in FIG. 3 for electrical interconnection between the terminal pads (not shown) on the active surface of the chip 5 and the corresponding I/O pins 20. Formed in the metallized layer 30 are a plurality of through holes 33 each penetrating through each one of the conductor lines 31 so as to receive herein the distal top end of each I/O pin 20 for connection between the conductor lines 31 and the respective I/O pins 20. On the inner peripheral edges around the center opening 34 of the metallized layer 30 there are located inner lead ends 35 of the conductor lines 31 which are arranged at a regular interval along the edges of the center opening 34, as best shown in FIG. 3, for connection to the respective terminal pads of the chip 5 by a conventional wire-bonding method. In this embodiment, there is utilized as the metallized layer 30 a conventional wiring plate consisting of a glass-cloth resin sheet as the substrate 32 on which are deposited the conductor lines 31. Suitable resin sheet may be made of epoxy, polyimide, polyester, and terafluoroethylen. Alternatively, the substrate 32 may be in the form of a thin film made of the above plastic material. Further, there may be utilized a leadframe made of copper, Ni-Fe alloy, or suitable metal as defining the conductor lines, which leadframes may be supported on the like plastic film to constitute the metallized layer.

Also included in the package is a flat-shaped heat sink member 40 having a top chip mounting surface 41 and a bottom heat radiation surface 42. The heat sink member 40 is integrally embedded within the carrier member 10 with its top surface 41 defining the bottom surface of the center recess 11 of the carrier member 10 and with the bottom heat radiation surface 42 exposed onto the bottom surface of the carrier member 10. The side wall 43 of the heat sink member 40 is inclined inwardly from the top chip mounting surface 41 to the bottom heat radiation surface 42. An external flange 44 extends sideward from the bottom periphery of the heat sink member 40 in such a manner that a portion of the flange 44 is integrally engaged in the carrier member 10, providing increased bonding strength between the carrier member 10 and the heat sink member 40, in addition to the provision of the inclined sidewall 43. The chip mounting surface 41 of the heat sink member 40 may be finished with gilding to which the chip 5 is affixed for connection through wires 6 with the inner led ends 35 of the metallized layer 30 extending into the center recess 11 of the carrier member 10. The heat sink member 40 may be made of aluminum, copper, steel, ceramics or any other material having a greater thermal conductivity than the plastic material for the carrier member 10.

Also integrally formed with the carrier member 10 is four positioning studs 12 projecting on the bottom surface thereof at the respective corners for abutment against the circuit board 1 when the package is mounted with the I/O pins 20 plugged into the plated through holes 2 of the board 1 in order to stably support the package in a spaced relation with the board 1, as best shown in FIG. 1. Thus, the package can be located in the exact position on the board 1, ensuring the subsequent soldering of the I/O pins 20 to be easily made for completion of the package mounting. In addition, the positioning studs 12 give enough spacing between the board 1 and the heat sink member 40 for enhancing the heat radiation therethrough.

The carrier member 10 is formed in its top surface at locations corresponding to the through holes 33 in the metallized layer 30 with a plurality of soldering pits 13 into each of which the distal top end of each I/O pin 20 and the adjacent land portion of the conductor line 31 are exposed. The soldering pits 13 are filled with a soldering material for permanent connection of the I/O pins 20 to the corresponding conductor lines 31.

FIG. 2 illustrates a set of separable upper and lower molding dice 50 and 51 utilized for fabricating the above chip carrier package. The lower molding die 51 is formed in its molding surface with a corresponding number of vertical slots 52 each receiving therein the lower portion of each I/O pin 20 with its top open end being entirely closed by the lower shoulder 22 of the I/O pin 20. Also formed in the lower molding die 51 are four top-open holes 53 for the molding of the positioning studs 12 and a shallow concavity 54 for receiving therein the bottom of the heat sink member 40. Projecting on the upper molding die 50 are a center core 55 and a corresponding number of pit-forming posts 57. The center core 55 is cooperative with the heat sink member 40 to form the center recess 11 in the carrier member 10 to be molded and has a flat end face which is in surface contact with the heat sink member 40. In the periphery of the flat end face of the core 55 there is formed a groove 56 into which the inner peripheral edge portion of the metallized layer 30 extends in order to be securely held between the core 55 and the heat sink member 40. Each of the pit-forming posts 57 has in its end face a counter bore 58 surrounded by annular wall 59 into which the distal top end of each I/O pin 20 is fitted.

For fabrication of the above chip carrier package, the I/O pins 20 are firstly inserted into the vertical slots 52 of the lower molding die 51 with its top portion projecting thereon and the heat sink member 40 is placed thereon with its bottom end engaged in the concavity 54. Then, the metallized layer 30 is placed over the I/O pins 20 in such as manner as to be supported on the upper flanges of the I/O pins 20 extending through the individual through holes 33 of the metallized layer 30. Next, the upper molding die 50 is closed with respect to the lower molding die 51 so as to bring the individual pit-forming posts 57 into engagement with the distal top ends of the I/O pins 20 and simultaneously bring the core 55 into contacting engagement with the heat sink member 40, as shown in FIG. 2. At this condition, the inner peripheral edge portion of the metallized layer 30 is firmly held between the core 55 and the heat sink member 40. After completion of this setting, the molten plastic material is filled between the upper and lower molding dice 50 and 51 to form thereat the chip carrier member 10 with the integral positioning studs 12 in which are integrally embedded the top portions of the I/O pins 20, the metallized layer 30, and the heat sink member 40. It should be noted at this time that since the inner peripheral edge portion of the metallized layer 30 is held between the core 55 and the heat sink member 40, that portion can be kept intact during the molding process so that it is prevented from being warped as well as that the molten plastic is effectively prevented from flowing onto that portion, eliminating the formation of any burr thereon. In this connection, the pit-forming posts 57 also act to press the metallized layer 30 at the annular walls 59 thereof against the upper flanges 21 of the I/O pins 20, preventing the entry of the molten plastic into the junctures between the I/O pins 20 and the conductor lines 31 and holding the metallized layer 30 in exact position during the molding process without causing any critical deformation thereof. Further, the provision of seating the bottom end of the heat sink member 40 into the concavity 54 can prevent the entry of the molten plastic over the bottom heat radiation surface 42 of the heat sink member 40, eliminating the formation of any burr thereat.

Figure 4:
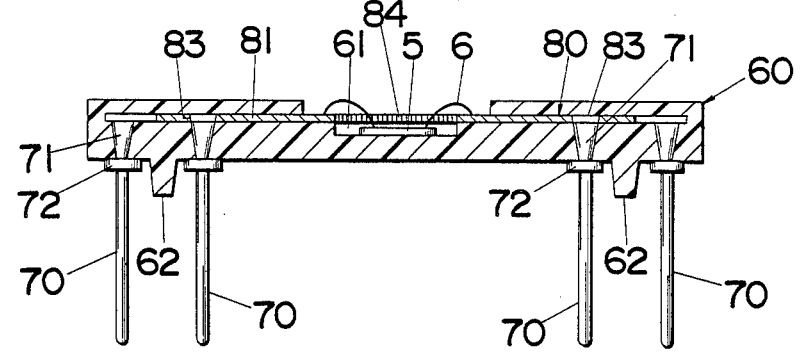
FIG. 4 is a cross sectional view of a plastic molded chip carrier package in accordance with a second preferred embodiment of the present invention.
Figure 5:
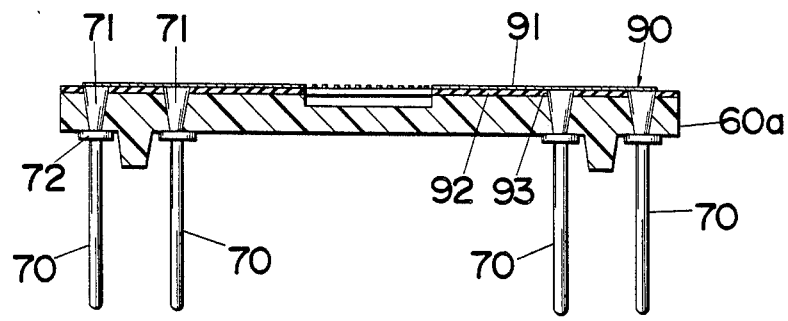
FIG. 5 is a cross sectional view of a modification of the second embodiment.

Second embodiment [FIGS. 4 and 5]

FIG. 4 shows a plastic molded chip carrier package in accordance with a second preferred embodiment of the present invention which is essentially identical to the first embodiment. The package includes a chip carrier member 60, a plurality of I/O pins 70, and a leadframe 80 having a corresponding number of conductor lines or leads 81 for interconnection of the terminal pads of the chip 5 and the respective I/O pins 70. The carrier member 60 is made of like plastic material as in the first embodiment to have a centrally disposed chip mounting recess 61 for the chip 5 and have integral positioning studs 62. The leadframe 80 has a center opening 84 around the periphery of which are arranged inner lead ends of the conductor leads 81 and it is integrally embeded within the carrier member 60 together with an enlarged tapering head 71 of each I/O pin 70 in such a manner as to expose the inner peripheral edge portion thereof for electrical connection with the chip 5 by wires 6. The enlarged tapering head 71 is cooperative with a shoulder 72 formed adjacent thereto to enhance the bonding strength of each I/O pin 70 to the carrier member 60. Each of the conductor leads 81 of the leadframe 80 is provided with a through hole 83 into which the distal end of the enlarged tapering head 71 of each I/O pin 70 fits tightly for ensuring electrical connection therebetween as well as for supporting the leadframe 80 on the I/O pins 70 prior to the molding process. In this connection, the inner led ends of the conductor leads 81 are backed up by a suitable plastic film (not shown) for stably keeping the inner lead ends aligned in a desired relation. The conductor leads 81 may have solder bumps for reliable electrical connection with the corresponding I/O pins 70.

FIG. 5 shows a modification of the second embodiment which is identical thereto except that a metallized layer 90 is embeded onto the top surface of a carrier member 60a. The metallized layer 90 utilized in this modification is of the same configuration as the first embodiment to have a plurality of conductor lines 91 deposited on a substrate 92 and is formed with a corresponding number of through holes 93 into which the top ends of the I/O pins 70 extend.

Figure 6:
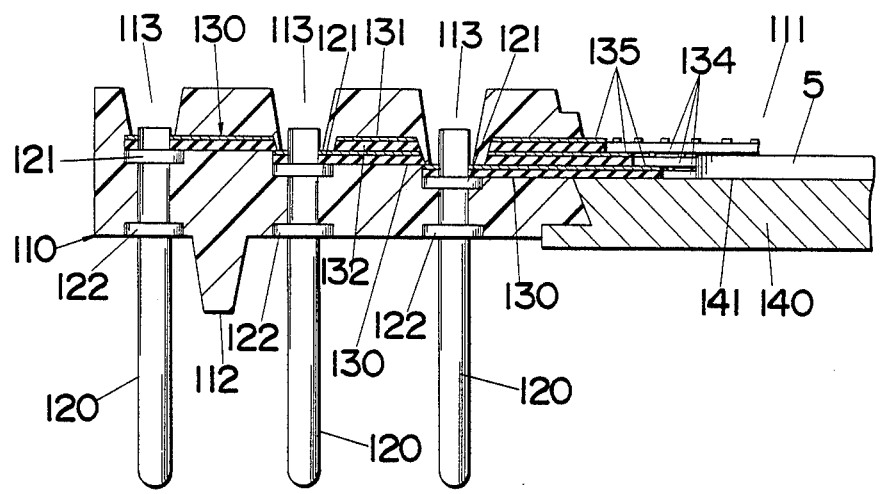
FIG. 6 is a partial cross sectional view of a plastic molded chip carrier package in accordance with a third preferred embodiment of the present invention.
Figure 7:
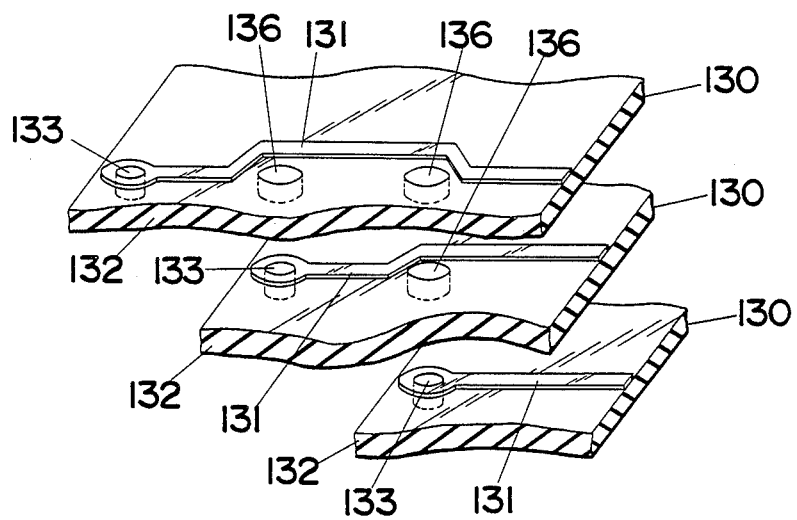
FIG. 7 is an exploded perspective partial view of metallized layers embedded in the above package.
Figure 8:
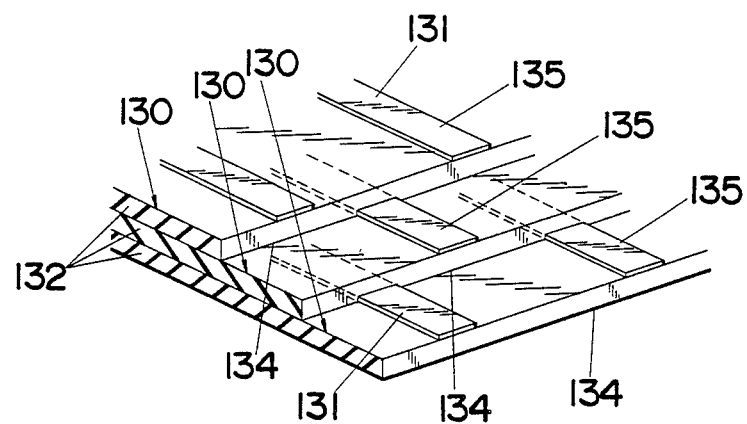
FIG. 8 is an enlarged perspective view of the inner peripheral edge portions of the above metallized layers each having thereon inner lead ends for connection with the chip.

Third embodiment [FIGS. 6 to 8]

Referring to FIG. 6, a plastic molded chip carrier package in accordance with a third embodiment of the present invention is shown which is identical to the first embodiment except that a plurality of metallized layers 130 are incorporated for providing a multilayer chip carrier package. Likewise in the first embodiment, a carrier member 110 is molded to have a center recess 111 for mounting an integrated circuit chip 5 having terminal pads on its active surface and to have an integrally embeded heat sink member 140 which defines on its top surface 141 the bottom of the center recess 111 on which the chip 5 is mounted. The carrier member 110 is also formed with like positioning studs 112 integrally projecting on the bottom thereof. Each of the metallized layers 130 is composed of like materials in the first embodiment to have a plurality of conductor lines 131 deposited on a substrate 132 and is shaped to have a center opening 134 of a size smaller than the center recess 111 of the carrier member 110.

The metallized layers 130 are integrally embedded together with the top portions of I/O pins 120 within the molded carrier member 110 in a stacked manner so as to project into the center recess 111 of the carrier member 110 the respective inner peripheral edge portions of the metallized layers 130 including the inner lead ends 135 of the conductor lines 131 while registering the center openings 134 and the center recess 111 at a common center. The size of the center opening 134 is greater in the upper metallized layer 130 than in the lower metallized layer 130 so that the inner peripheral edge portions of the all metallized layers 130 are exposed in vertically staggered relation with each other for permitting individual electrical connection of the metallized layers 130 to the chip 5 at these staggered inner peripheral edge portions. As shown in FIG. 8, the inner lead ends 135 of the metallized layers 130 are also staggered horizontally with respect to those of the adjacent metallized layers 130 for facilitating the wiring between the inner lead ends 135 and the terminal pads on the chip 5.

In addition to the through holes 133 formed in the respective metallized layers 130 for connection with the corresponding I/O pins 120, the upper metallized layer 130 is formed with a plurality of clearance holes 136 at registering locations with the through holes 133 in the lower metallized layers 130, which locations are offset from the conductor lines 131 on that layer, as shown in FIG. 7. The clearance holes 136, each having a greater diameter than the through hole 133, receive therein the distal top ends of the I/O pins 120 respectively, which extend through the through holes 133 in the lower metallized layer 130 for connection with the corresponding I/O pins 120. Formed in the top surface of the carrier member 110 are a plurality of soldering pits 113 which are located in registration with the clearance holes 136 and with the through holes 133 provided in the uppermost metallized layer 130 and into which are exposed the distal top ends of the I/O pins 120 and the adjacent land portions of the conductor lines 131. Each of the soldering pits 113 is shaped by like pit-forming post on the molding die as utilized in the first embodiment to have its peripheral wall completely surrounding the edge of the clearance hole or holes 136 in the upper metallized layer of layers 130, sealing off the conductor lines 131 thereon and allowing only the desired conductor lines 131 of the lower metallized layers 130 to expose in the soldering pit 113. For permanently connecting the I/O pins 120 to the corresponding conductor lines 131 a soldering material is filled into the individual soldering pits 113. The other constructions and the advantageous features are identical to those of the first embodiment.

Figure 9:
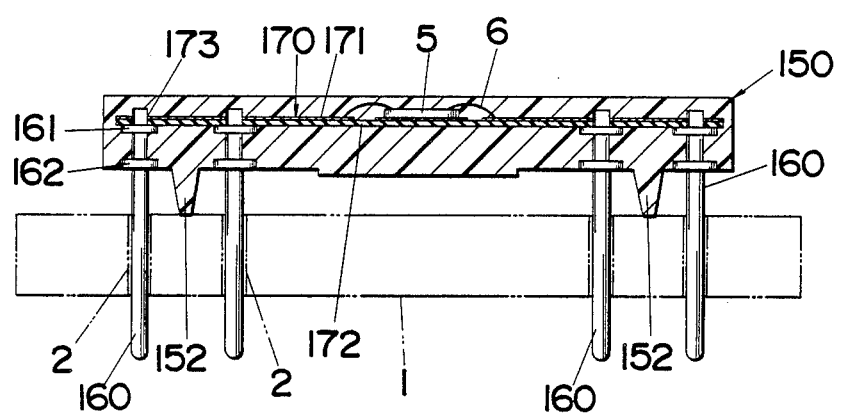
FIG. 9 is a cross sectional view of a plastic molded chip carrier package in accordance with a fourth embodiment of the present invention.
Figure 10:
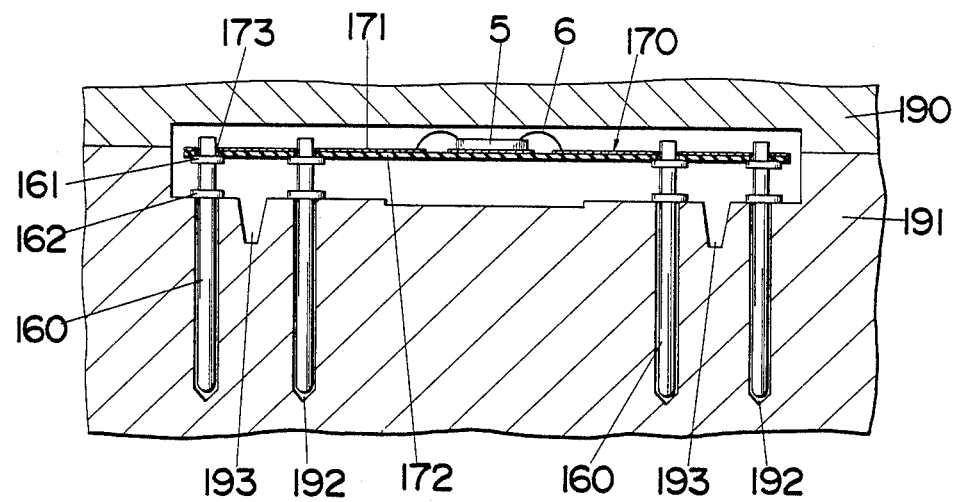
FIG. 10 is a cross sectional view illustrating a set of upper and lower molding dice utilized for molding the above package and illustrating parts placed between the dice prior to the molding of the above package.

Fourth embodiment [FIGS. 9 and 10]

FIG. 9 shows a plastic molded chip carrier package in accordance with a fourth embodiment of the present invention which is similar to the first embodiment except that an integrated circuit chip 5 is integrally embeded or encapsulated within a plastic molded carrier member 150 together with a metallized layer 170 and a plurality of I/O pins 160 to form a final package product. The chip 5 is centrally mounted directly on the metallized layer 170 composed of a plurality of conductor lines 171 deposited on the like substrate 172 as in the first embodiment and is connected by means of wires 6 to the individual conductor lines 171 fanning in from the outer edges of the metallized layer 170 toward the center portion adjacent the chip 5. Likewise in the first embodiment, the metallized layer 170 has a number of through holes 173 for receiving the top ends of the I/O pins 160 with upper and lower shoulders 161 and 162.

As shown in FIG. 10, the metallized layer 170 thus mounting the chip 5 is placed between a set of upper and lower molding dice 190 and 191 in a spaced relation from the molding surfaces by the I/O pins 160 each having its lower portion inserted in vertical slot 192 in the lower molding die 191, at which condition the lower shoulder 162 of each I/O pin 160 closes the top open end of the vertical slot 192 while the upper shoulder 161 supports the metallized layer 170 at the periphery of each through hole 173. Then, the space or cavity between the upper and lower molding dice 190 and 191 is filled with a molten plastic to form thereat the molded chip carrier member 150 in which the chip 5 and metallized layer 170 are encapsulated together with the top portions of the I/O pins 160. The carrier member 150 also includes integral positioning studs 152 which are formed in top-open holes 193 in the lower molding die 191 for mounting the chip carrier package in a spaced relation on the conventional circuit board 1 with the I/O pins 160 plugged into the plated through holes 2 provided therein.

Figure 11:
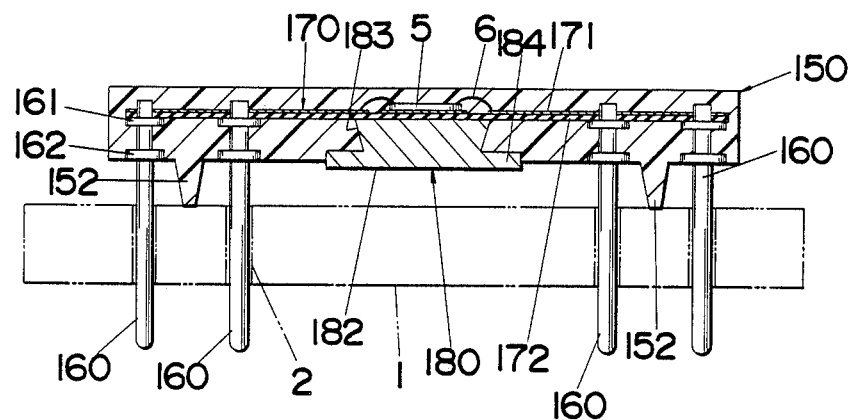
FIG. 11 is a cross sectional view of a modification of the fourth embodiment.

A modification of the fourth embodiment is shown in FIG. 11 which is identical thereto except for a heat sink member 180 integrally embedded within the chip carrier member 150. The heat sink member 150 is of the same configuration as employed in the first embodiment to have an inclined sidewall 183 and a sideward extending flange 184, and is firmly embedded in the carrier member 150 with its bottom heat radiation surface 182 exposed on the bottom thereof.

What is claimed is:

1. A plastic molded chip carrier package comprising:
   a carrier member, being made of a plastic material, for mounting an integrated circuit chip at a central portion;
   a plurality of I/O pins each having at a first end a pair of spaced shoulders integrally embedded into said carrier member and each I/O pin at a second end protruding outwardly from the carrier member; and
   a conductor member integrally embedded in said carrier member, said conductor member including a substrate and a metallizing layer formed on said substrate, said metallizing layer being a plurality of conductor lines for electrical interconnection between terminals of said integrated circuit chip and corresponding I/O pins, an upper shoulder of said pair of spaced shoulders of each I/O pin being in supporting contact with said substrate.

2. A plastic molded chip carrier package according to claim 1, wherein a lower shoulder of said pair of shoulders of each I/O pin is flush with a bottom surface of the carrier member.

3. A plastic molded chip carrier package as set forth in claim 1, wherein said carrier member is integrally formed with at least one pair of positioning studs which project from the carrier member for abutment against a support member on which the package is to be mounted with said I/O pins plugged into metallized through holes formed therein for positive positioning of said package on the support member.

4. A plastic molded chip carrier package as set forth in claim 3, wherein said conductor line has a through hole into which the corresponding I/O pin extends with a distal top end projecting above the conductor line; and wherein said carrier member is molded to accommodate therein the conductor member in such a way as to form in the surface thereof a plurality of soldering pits which are in registration with individual through hole locations and in which distal top ends of the I/O pins and the adjacent portions of the conductor lines are exposed, said soldering pit being filled with soldering material for permanent connection between the I/O pins and the corresponding conductor lines.

5. A plastic molded chip carrier package as set forth in claim 3, further including a heat sink member having greater thermal conductivity than said carrier member and shaped to have a chip mounting surface and an opposed heat radiation surface, said heat sink member being integrally embedded centrally in the carrier member with said heat radiation surface exposed on a surface of the carrier member.

6. A plastic molded chip carrier package as set forth in claim 5, wherein said heat sink member is a flat shape member with a side wall being inclined inwardly from the chip mounting surface adjacent the conductor member to the heat radiation surface, said heat sink member being provided with an external flange extending sidewardly from a periphery of the heat radiation surface and being engaged in the carrier member.

7. A plastic molded chip carrier package as set forth in claim 5, wherein said heat sink member has said heat radiating surface projecting beyond a general surface of the carrier member.

8. A plastic molded chip carrier package comprising:
   a carrier member for mounting an integrated circuit chip at a central portion, said carrier member, being made of a plastic material of a flat configuration, having a top surface and a bottom surface and having a center recess in which the integrated circuit chip is mounted;
   a plurality of I/O pins each having at a first end a pair of shoulders integrally embedded into the carrier member and each pin at a second end protruding from the bottom surface of the carrier member;
   a metallized layer being integrally embedded into the carrier member, together with said I/O pins, and having a center opening smaller than the center recess of the carrier member, said metallized layer being composed of a plurality of conductor lines formed on a substrate, an upper shoulder of said pair of shoulders of each I/O pin being in supporting contact with said substrate, said metallized layer for electrical interconnection of said I/O pins with terminals of the integrated circuit chip, said conductor lines having inner lead ends arranged on an inner peripheral edge portion around said center opening of the metallized layer;
   a heat sink member integrally embedded in the center portion of said carrier member with a bottom surface exposed to the bottom surface of the carrier member and with a top surface defining the bottom surface of said center recess for mounting said chip thereon;
   at least one pair of positioning studs integrally molded with the carrier member to project from the bottom surface the carrier member for abutment against a support member on which the package is mounted with said I/O pins plugged into metallized through holes formed therein for positive positioning of said package on said support member; and
   said metallized layer being embedded within the carrier member in such a manner as to project the inner peripheral edge portion, including said inner lead ends of the conductor lines, into the center recess and to support the inner peripheral edge portion on a periphery of the top suface of said heat sink member for connection with the integrated circuit chip on the heat sink member.

9. A plastic molded chip carrier package as set forth in claim 8, wherein said metallized layer has a plurality of through holes each of which corresponds to each of the conductor lines and into each of which the corresponding I/O pins extends with a distal top end projecting above the conductor line; and wherein said carrier member is molded to accommodate therein the metallized layer in such as a way as to form in the top surface thereof a plurality of soldering pits which are in registration with individual through hole locations and in which the distal top ends of the I/O pins and the adjacent portions of the conductor lines are exposed, said soldering pit being filled with a soldering material for permanent connection between the I/O pins and the corresponding conductor lines.

10. A plastic molded chip carrier package according to claim 8, wherein a lower shoulder of said pair of shoulders of each I/O pin is flush with a bottom surface of the carrier member.

11. A plastic molded chip carrier package comprising:
a carrier member for mounting an integrated circuit chip at a central portion, said carrier member, being made of a plastic material of a flat configuration, having a top surface and a bottom surface and having a center recess in which the integrated circuit chip is mounted;
a plurality of I/O pins each having at a first end a pair of shoulders integrally embedded into said carrier member and having a second end which protrudes from the bottom surface thereof;
a plurality of metallized layers which are integrally embedded within the carrier member in a stacking relation to each other, said metallized layers being provided with respective center openings having a common center and being of sizes smaller than said center recess of the carrier member, each of said metallized layers having a plurality of conductor lines formed on a substrate for electrical interconnection between terminals of the integrated circuit chip and corresponding I/O pins, an upper shoulder of said pair of shoulders of each I/O pin being in supporting contact with said substrate of a corresponding metallized layer, the conductor lines of each metallized layer having inner lead ends arranged on an inner peripheral edge portion around the center opening thereof, and said center opening being of a size larger in an upper metallized layer than in a lower metallized layer such that the inner lead ends of the conductor lines on the metallized layers are exposed in the center recess of the carrier member in a staggered relation with each other for permitting the conductor lines of the individual metallized layers to be connected to the integrated circuit chip at the staggered inner lead ends;
a heat sink integrally embeded into the center portion of said carrier member with a bottom surface exposed to the bottom surface of the carrier member and with a top surface defining the bottom surface of said center recess for mounting thereon said integrated circuit chip; and
at least one pair of positioning studs integrally molded with the carrier member to project from the bottom surface thereof for abutment against a support member on which the package is to be mounted with I/O pins plugged into metallized through holes formed therein for positive positioning of said package on the support member.

12. A molded plastic chip carrier package as set forth in claim 11, wherein each of said metallized layer has a plurality of through holes into which corresponding I/O pins extend respectively with distal top ends projecting above the conductor lines, the upper metallized layer having clearance holes which are in registration with the through holes in the lower metallized layer and into which extend the distal top ends of the I/O pins which are to be electrically connected to the conductor lines of the lower metallized layer; said carrier member being formed in the top surface at the through hole locations with soldering pits in which the distal top ends of the I/O pins are exposed together with adjacent portions of the corresponding conductor lines while the conductor lines located around the clearance holes in the upper metallized layer being sealed behind a surrounding wall of the soldering pits; and said soldering pits being filled with a soldering material for providing permanent interconnections between the I/O pins and the corresponding conductor lines in the respective metallized layers.

13. A plastic molded chip carrier package according to claim 11, wherein a lower shoulder of said pair of shoulders of each I/O pin is flush with a bottom surface of the carrier member.

14. A plastic molded chip carrier package comprising:
a carrier member, being made of a plastic material, for mounting an integrated circuit chip at central portion;
a plurality of I/O pins each having an enlarged tapering head at a top end portion integrally embedded into said carrier member and each I/O pin at a bottom end protruding outwardly from the carrier member; and
a conductor member integrally embedded in said carrier member, said conductor member including a leadframe having a plurality of conductor lines for electrical interconnection between terminals of said integrated circuit chip and corresponding I/O pins, at a top of said enlarged tapering head of each I/O pin being in supporting contact with said leadframe.

15. A plastic molded chip carrier package according to claim 14, wherein said enlarged tapered heat cooperates with a shoulder formed adjacent thereto.

16. A plastic molded chip carrier package comprising:
a carrier member, being made of a plastic material, for mounting an integrated circuit chip at a central portion;
a plurality of I/O pins each having a shoulder at a top end portion integrally embedded into said carrier member and each I/O pin protruding outwardly from the carrier member; and
a conductor member integrally embedded in said carrier member, said conductor member including a substrate and a metallizing layer formed on said substrate, said metallizing layer being a plurality of conductor lines for electrical interconnection between terminals of said integrated circuit chip and corresponding I/O pins, said shoulder of each I/O pin being in supporting contact with said substrate, wherein said conductor line has a through hole into which the corresponding I/O pin extends with a distal top end projecting above the conductor line; and wherein said carrier member is molded to accommodate therein the conductor member in such a way as to form in the surface thereof a plurality of soldering pits which are in registration with individual through hole locations and in which the distal top ends of the I/O pins and adjacent portions of the conductor lines are exposed, said soldering pit being filled with soldering material for permanent connection between the I/O pins and the corresponding conductor lines.

17. A plastic molded chip carrier package as set forth in claim 3, wherein the integrated circuit chip is integrally encapsulated together with the conductor member within said carrier member.

18. A plastic molded chip carrier package as set forth in claim 16, wherein said carrier member is integrally formed with at least one pair of positioning studs which project from the carrier member for abutment against a support member on which the package is to be mounted with said I/O pins plugged into metallized through holes formed therein for positive positioning of said package on the support member.

19. A plastic molded chip carrier package as set forth in claim 18, wherein the integrated circuit chip is integrally encapsulated together with the conductor member within said carrier member.

20. A plastic molded chip carrier package as set forth in claim 18, further including a heat sink member having greater thermal conductivity than said carrier member and shaped to have a chip mounting surface and an opposed heat radiation surface, said heat sink member being integrally embedded centrally in the carrier member with said heat radiation surface exposed on a surface of the carrier member.

21. A plastic molded chip carrier package as set forth in claim 20, wherein said heat sink member is a flat shape member with a side wall being included inwardly from the chip mounting surface adjacent the conductor member to the heat radiation surface, said heat sink member being provided with an external flange extending sidewardly from a periphery of the heat radiation surface and being engaged in the carrier member.

22. A plastic molded chip carrier package as set forth in claim 20, wherein said heat sink member has said heat radiating surface projecting beyond a general surface of the carrier member.

23. A plastic molded chip carrier package comprising:
   a carrier member for mounting an integrated circuit chip at a central portion, said carrier member, being made of a plastic material of a flat configuration, having a top surface and a bottom surface and having a center recess in which the integrated circuit chip is mounted;
   a plurality of I/O pins each having a shoulder at a top portion integrally embedded into the carrier member so as to protrude from the bottom surface thereof;
   a metallized layer being integrally embedded into the carrier member, together with said I/O pins, and having a center opening smaller than the center recess of the carrier member, said metallized layer being composed of a plurality of conductor lines formed on a substrate, said shoulder of each I/O pin being in supporting contact with said substrate, said metallized layer for electrical interconnection of said I/O pins with terminals of the integrated circuit chip, said conductor lines having inner lead ends arranged on an inner peripheral edge portion around said center opening of the metallized layer;
   a heat sink member integrally embedded in the center portion of said carrier member with a bottom surface exposed to the bottom surface of the carrier member and with a top surface defining the bottom surface of said center recess for mounting said chip thereon;
   at least one pair of positioning studs integrally molded with the carrier member to project from the bottom surface the carrier member for abutment against a support member on which the package is mounted with said I/O pins plugged into metallized through holes formed therein for positive positioning of said package on said support member and
   said metallized layer being embedded within the carrier member in such a manner as to project the inner peripheral edge portion, including said inner lead ends of the conductor lines, into the center recess and to support the inner peripheral edge portion on a periphery of the top surface of said heat sink member for connection with the integrated circuit chip on the heat sink member, wherein said metallized layer has a plurality of through holes each of which corresponds to each of the conductor lines and into each of which the corresponding I/O pins extends with a distal top end projecting above the conductor line; and wherein said carrier member is molded to accommodate therein the metallized layer in such a way as to form in the top surface thereof a plurality of soldering pits which are in registration with individual through hole locations and in which the distal top ends of the I/O pins and the adjacent portions of the conductor lines are exposed, said soldering pit being filled with a soldering material for permanent connection between the I/O pins and the corresponding conductor lines.

24. A plastic molded chip carrier package comprising:
   a carrier member for mounting an integrated circuit chip at a central portion, said carrier member, being made of a plastic material of a flat configuration, having a top surface and a bottom surface and having a center recess in which the integrated circuit chip is mounted;
   a plurality of I/O pins each having a shoulder at a top end portion integrally embedded into said carrier member to protrude from the bottom surface thereof;
   a plurality of metallized layers which are integrally embedded within the carrier member in a stacking relation to each other, said metallized layers being provided with respective center openings having a common center and being of sizes smaller than said center recess of the carrier member, each of said metallized layers having a plurality of conductor lines formed on a substrate for electrical interconnection between terminals of the integrated circuit chip and corresponding I/O pins, said shoulder of each I/O pin being in supporting contact with said substrate of a corresponding metallized layer, the conductor lines of each metallized layer having inner lead ends arranged on an inner peripheral edge portion around the center opening thereof, and said center opening being of a size larger in an upper metallized layer than in a lower metallized layer such that the inner lead ends of the conductor lines on the metallized layers are exposed in the center recess of the carrier member in a staggered relation with each other for permitting the conductor lines of the individual metallized layers to be connected to the integrated circuit chip at the staggered inner lead ends;
   a heat sink integrally embedded into the center portion of said carrier member with a bottom surface exposed to the bottom surface of the carrier member and with a top surface defining the bottom surface of said center recess for mounting thereon said integrated circuit chip; and at least one pair of positioning studs integrally molded with the carrier member to project from the bottom surface thereof for abutment against a support member on which the package is to be mounted with I/O pins plugged into metallized through holes formed therein for positive positioning of said package on the support member; wherein each of said metallized layer has a plurality of through holes into which corresponding I/O pins extend respectively with distal top ends projecting above the conductor lines, the upper metallized layer having clearance holes which are in registration with the through holes in the lower metallized layer and into which extend the distal top ends of the I/O pins which are to be electrically connected to the conductor lines of the lower metallized layer; said carrier member being formed in the top surface at the through hole locations with soldering pits in which the distal top ends of the I/O pins are exposed together with adjacent portions of the corresponding conductor lines while the conductor lines located around the clearance holes in the upper metallized layer being sealed behind a surrounding wall of the soldering pits; and said soldering pits being filled with a soldering material for providing permanent interconnection between the I/O pins and the corresponding conductor lines in the respective metallized layers.

* * * * *